(12) United States Patent
Athan

(10) Patent No.: US 9,720,026 B1
(45) Date of Patent: Aug. 1, 2017

(54) RADIATION HARDENED CHIP LEVEL INTEGRATED RECOVERY APPARATUS, METHODS, AND INTEGRATED CIRCUITS

(71) Applicant: DEFENSE ELECTRONICS CORPORATION, Pinellas Park, FL (US)

(72) Inventor: Stephan P. Athan, Tampa, FL (US)

(73) Assignee: Defense Electronics Corporation, Pinellas Park, FL (US)

( * ) Notice: Subject to any disclaimer, the term of this patent is extended or adjusted under 35 U.S.C. 154(b) by 0 days.

(21) Appl. No.: 15/228,172

(22) Filed: Aug. 4, 2016

Related U.S. Application Data

(63) Continuation of application No. 13/793,065, filed on Mar. 11, 2013, now Pat. No. 9,438,025.

(51) Int. Cl.
*G01R 31/02* (2006.01)

(52) U.S. Cl.
CPC .................. *G01R 31/025* (2013.01)

(58) Field of Classification Search
CPC .......... G11C 2029/5006; G11C 11/406; G01R 31/025; G05F 1/10; G05F 3/30
USPC ...................... 327/538, 539; 323/313; 361/42
See application file for complete search history.

(56) References Cited

U.S. PATENT DOCUMENTS

| | | | |
|---|---|---|---|
| 5,929,448 A | 7/1999 | Zimmerman | |
| 6,144,214 A * | 11/2000 | Athan | G01R 31/3004 324/750.3 |
| 6,476,597 B1 | 11/2002 | Spratt et al. | |
| 6,583,470 B1 | 6/2003 | Maki et al. | |
| 7,212,056 B1 | 5/2007 | Belov | |
| 7,263,631 B2 | 8/2007 | VanBuren | |
| 7,598,773 B2 | 10/2009 | Wyatt | |
| 7,737,535 B2 | 6/2010 | Gardner | |
| 7,840,000 B1 | 11/2010 | Marek | |
| 7,863,733 B2 * | 1/2011 | Flautner | H01L 25/0657 257/686 |
| 7,863,941 B1 | 1/2011 | Nguyen et al. | |

(Continued)

OTHER PUBLICATIONS

"Shallow Junctions" EE 311/Saraswat, Aug. 2004, pp. 1-20.

(Continued)

*Primary Examiner* — Thienvu Tran
*Assistant Examiner* — David M Stables
(74) *Attorney, Agent, or Firm* — RatnerPrestia

(57) ABSTRACT

Methods, apparatus, and integrated circuits that provide radiation hardening through chip level integrated recovery are provided. The apparatus may include first and second circuits within a partition of an integrated circuit having isolated grounds and a state machine configured to monitor current leakage of the first circuit while the first circuit is powered on and to power on the second circuit and power off the first circuit when the monitored first circuit current leakage exceeds a first current leakage threshold. The method may include powering a first circuit of a partition within an integrated circuit, monitoring current leakage of the first circuit while the first circuit is powered on and the second circuit is powered off, storing values representing a current leakage signature over an operating range of the first circuit, and powering off the first circuit and powering on the second circuit when the monitored first circuit current leakage exceeds a corresponding first current leakage threshold with the stored values.

20 Claims, 6 Drawing Sheets

(56) References Cited

U.S. PATENT DOCUMENTS

| | | |
|---|---|---|
| 8,214,777 B2 | 7/2012 | Joshi et al. |
| 8,766,703 B1 | 7/2014 | Yang et al. |
| 9,191,009 B1 | 11/2015 | Clark et al. |
| 2008/0197914 A1 | 8/2008 | Shimizu et al. |
| 2010/0257492 A1 | 10/2010 | Joshi et al. |
| 2012/0293197 A1 | 11/2012 | Joshi et al. |
| 2015/0349775 A1 | 12/2015 | Clark et al. |

OTHER PUBLICATIONS

Sharma et al., "Low Dose Rate Radiation Testing of Advanced CMOS Technology (AC/ACT) Series Parts for Space Flight Applications," IEEE, 1992, pp. 53-57.

Fleetwood et al., "An Improved Standard Total Dose Test for CMOS Space Electronics," IEEE Trans-actions on Nuclear Science, vol. 36 No. 6, Dec. 1989, pp. 1963-1970.

Christopher J. Nicklaw, "Multi-Level Modeling of Total Ionizing Dose in a-$SiO_2$; First Principles to Circuits," Dissertation submitted to Faculty of Graduate School of Vanderbilt University, Nashville, TN, Aug. 2003, pp. 1-10.

Schwank et al., "Radiation Hardness Assurance Testing of Microelectronic Devices and Integrated Circuits: Radiation Environments, Physical Mechanisms, and Foundations for Hardness Assurance," Sandia Natl. Laboratories Document SAND-2008-6851P, pp. 1-10.

\* cited by examiner

RADIATION HARDENED CHIP LEVEL INTEGRATED RECOVERY APPARATUS, METHODS, AND INTEGRATED CIRCUITS

STATEMENT REGARDING FEDERALLY SPONSORED RESEARCH OR DEVELOPMENT

This invention was made with Government support under FA9453-09-C-0013 awarded by the United States Air Force. The Government has certain rights in the invention.

FIELD OF THE INVENTION

The present invention relates to the field of microelectronics and, more particularly, to radiation hardened integrated circuits including chip level integrated recovery apparatus and methods.

BACKGROUND OF THE INVENTION

Semiconductor devices can be damaged by the effects of radiation from natural and man-made sources. For example, radiation may change the electrical properties of solid state devices, leading to potential failure of systems using such devices.

Radiation hardened refers to the ability of a semiconductor device to withstand or recover from radiation without significant alteration of its electrical characteristics. A semiconductor device is said to be radiation hardened if it can continue to function within specifications after exposure to a specified amount and type of radiation.

Applications for radiation hardened semiconductor devices include use in harsh environments such as outer space, nuclear reactors, and particle accelerators.

SUMMARY OF THE INVENTION

The present invention is embodied in methods, apparatus, and integrated circuits that provide radiation hardening through chip level integrated recovery. The apparatus may include first and second circuits within a partition of an integrated circuit having isolated grounds and a partition state machine coupled to the first circuit and the second circuit and configured to monitor current leakage of the first circuit while the first circuit is powered on and to power on the second circuit and power off the first circuit when the monitored first circuit current leakage exceeds a first current leakage threshold.

The method may include powering a first circuit of a partition within an integrated circuit, monitoring current leakage of the first circuit while the first circuit is on and the second circuit is off, storing values representing a current leakage signature over an operating range of the first circuit, and powering off the first circuit and powering on the second circuit when the monitored first circuit current leakage exceeds a corresponding current leakage threshold within the stored values.

BRIEF DESCRIPTION OF THE DRAWINGS

The invention is best understood from the following detailed description when read in connection with the accompanying drawings, with like elements having the same reference numerals. It will be understood that one or more lines connecting components may represent bus lines. Included in the drawings are the following figures.

DETAILED DESCRIPTION OF THE INVENTION

Figure 1:
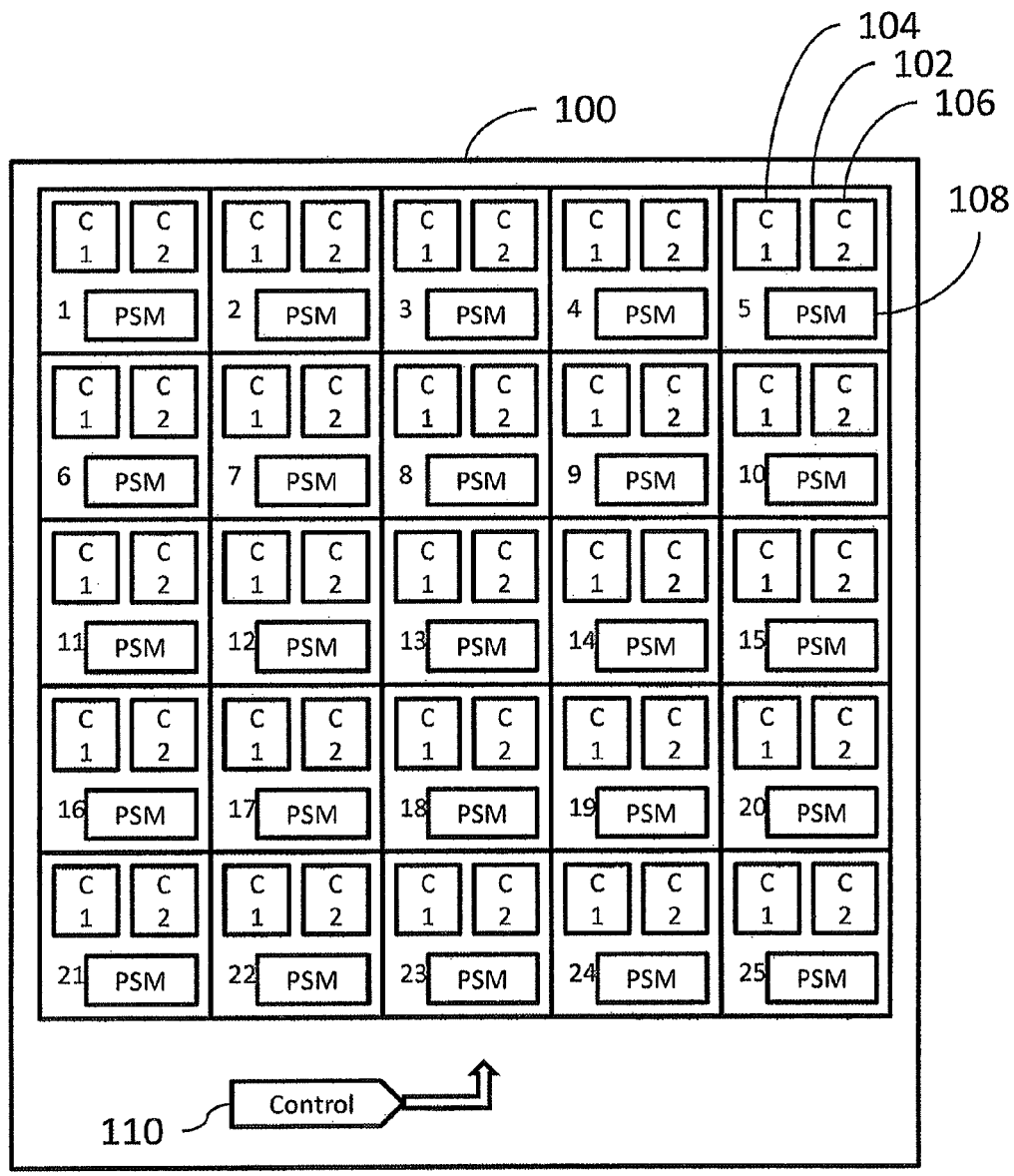
FIG. 1 is a block diagram of a radiation hardened integrated circuit in accordance with aspects of the present invention.

FIG. 1 depicts an integrated circuit 100 including a plurality of partitions such as partition 102, which includes reference numeral "5." Each of the partitions include at least two circuits that may be tested (e.g., using their current leakage profiles) during their operation (referred to herein as circuits under test (CUT)). In the illustrated embodiment, each partition also includes a partition state machine "PSM." It will be understood by one of skill in the art that in other embodiments multiple partitions may share a partition state machine. In one embodiment, the partitions may be uniform in size. In other embodiments, one or more of the partitions may have different sizes. In an exemplary embodiment, the integrated circuit is a complementary metal-oxide-semiconductor (CMOS) integrated circuit such as a bulk CMOS integrated circuit. However, other process technologies including by way of non-limiting example SOI, SiGe, GaN, InP, SiC, carbon nano tubes, and graphene may be employed.

Partition 102 includes a first circuit "C1" 104, a second circuit "C2" 106, and a PSM 108. The circuits are strategic subsections of the original integrated circuit architecture sized to satisfy design, layout, performance, and test criteria using current leakage profiles. As will become apparent from the below description, in each partition the PSM is connected to, and controls, each of the circuits in that partition. For example, PSM 108 is coupled to the first circuit 104 and the second circuit 106 in partition 102. Although 25 partitions are illustrated, integrated circuit 100 may include more or fewer partitions of the same or different circuit size. Additionally, although two circuits are illustrated in each partition, each partition does not necessarily have to include the same number of circuits and one or more partitions may include more or fewer circuits.

The integrated circuit 100 includes at least one control line(s) 110. The control lines 110 route control signals within the integrated circuit 100. In one embodiment, control line(s) are coupled to each of the PSMs 108. For example, a control line 110 may be coupled to PSM 108 to supply a signal from the global logic for the integrated circuit to the partition 102. The control line(s) 110 are routed in the integrated circuit level to communicate global timing for controlling all partitions in the integrated circuit. The control line(s) 110 may provide a status bit/strobe bit prompting the PSMs 108 to sample the current leakage (i.e., quiescent current) for the first/second circuits 104/106. This enables the input vectors at the primary inputs of the circuits (e.g., first circuit 104 and second circuit 106) during a sampling cycle to double as the actual processed logic as well as the test vectors. The control signal(s) passing on the control line(s) 110 can be customized for specific time based on the application (e.g., periodic, aperiodic, synchronous, or asynchronous). In addition, there is no need to store the logic state at the primary inputs to the first and second circuits during a sampling cycle for combinational logic.

Physical layouts for the integrated circuit 100 including partitions described herein can be designed using design rule check (DRC) rules specifying tolerances for the fabrication of the physical integrated circuit, layout versus schematic (LVS) rules for checking the consistency between the physical design and the logical design of the integrated circuit, and layout parasitic extraction (LPE) rules defining how to extract parasitic resistance and capacitance from the integrated circuit. Additionally, timing signals coordinate actions of the circuits within the integrated circuit. Suitable DRC rules, LVS rules, LPE rules, and timing signals will be understood by one of skill in the art from the description herein.

Figure 2A:
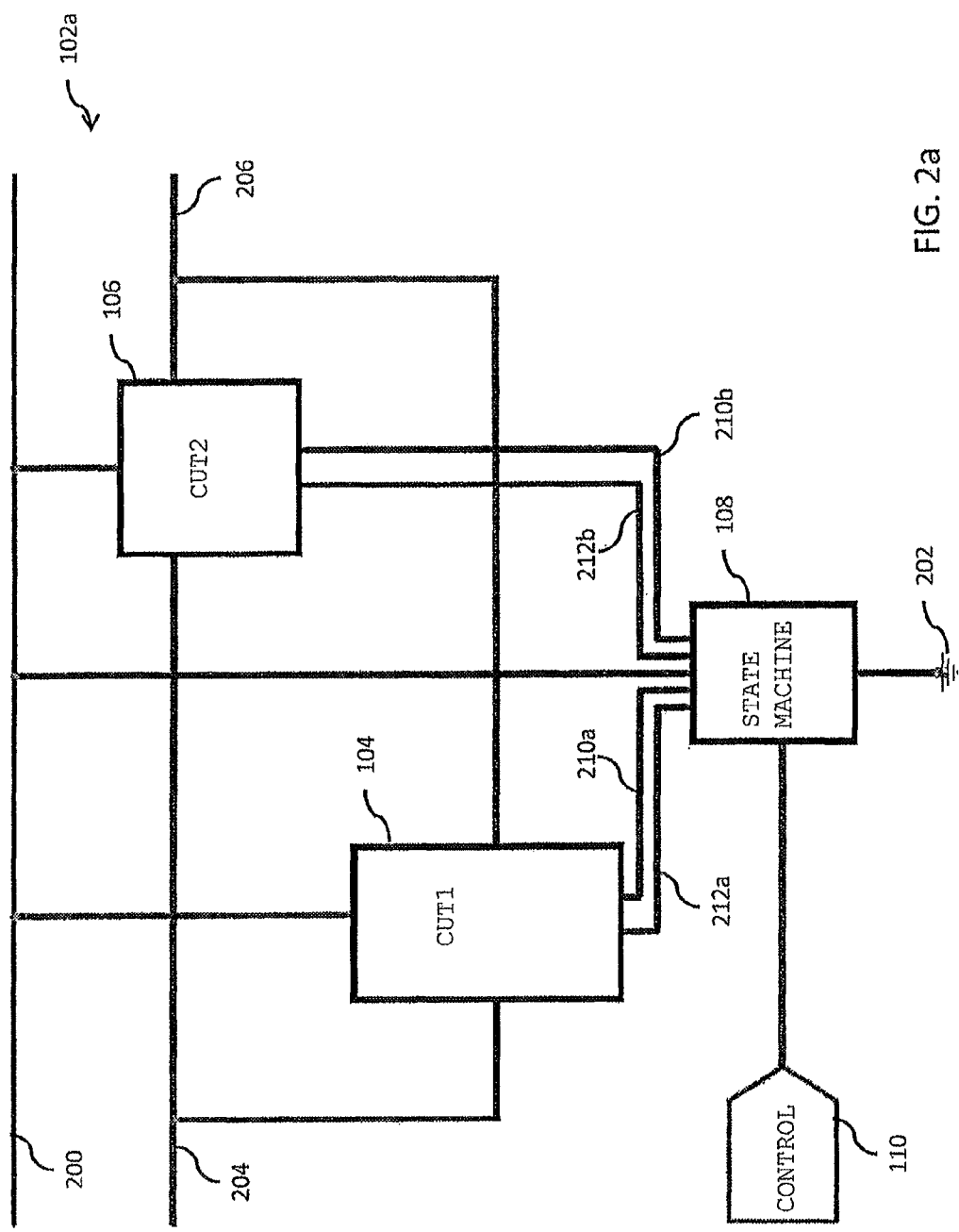
FIG. 2a is a block diagram partially in schematic form of a radiation hardened partition of an integrated circuit in accordance with aspects of the present invention.

FIG. 2a depicts a high level configuration of a partition 102a in accordance with one embodiment of the present invention. A bias voltage bus (VDD) 200 supplies power to the partition with reference to a ground bus 202 in this illustrated embodiment. In this configuration, the first circuit 104 and the second circuit 106 are each coupled directly to an input bus 204 and to an output bus 206. The ground 212a and 212b for the partitions is isolated from the ground 202 for the integrated circuit 100 (FIG. 1). Grounds 212a and 212b for the circuits under test are isolated from one another. Furthermore, grounds 212a and 212b are isolated from circuit ground 202. Isolation of the grounds may be accomplished by eliminating ground ties from the circuits 104 and 106 subject to testing from the global ground 202 bus. This provides CUT circuit isolation from global chip ground. This layout modification with CUT and chip ground may impose verification violations, but does not degrade circuit performance and enables operation of the built-in current sensor (BICS)/circuit level integrated recovery (CLIR) methodology of the present invention.

In one embodiment, where transimpedance amplifiers 302a, b (FIG. 3) comprised of N-channel field effect transistors (NFET) are utilized in the partitioned state machine 108, the source (Vss) for the NFETs are in common and tied to chip GND. This enables a voltage to be impressed at the transimpedance amplifiers (Tamp) for any CUT. This additionally enables detection/diagnosis of faults in individual partitions.

In the configuration depicted in FIG. 2a, the first circuit 104 and the second circuit 106 may each be configured with tri-state output to the output bus 206 that is capable of presenting a high level of resistance at the output in response to a control signal (described below). In one embodiment, the first and second circuits are interchangeable from a functionality point of view (e.g., substantially identical).

A partitioned state machine 108 is coupled to the first circuit 104 and the second circuit 106. Additionally, the partitioned state machine 108 is coupled to bias voltage bus 200 and ground bus 202. The partitioned state machine 108 communicates tri-state control information to the first circuit over a first control path 210a and communicates tri-state control information to the second circuit over a second control path 210b. Additionally, the partitioned state machine 108 receives current leakage (IDDQ) from the first circuit 104 over a first path 212a and current leakage from the second circuit 106 over a second path 212b.

The current leakage of the first and second circuits may indicate IDDQ leakage of the first and second circuits, respectively, with respect to radiation exposure. Once a circuit under test is activated (i.e., powered on), it becomes susceptible to damage due to radiation effects including increased current consumption and/or logical/functional failure. Typically, the longer an active circuit is exposed to radiation while under a bias voltage, the greater the current leakage. Once the circuit is deactivated (i.e., powered off), or radiation is removed, the circuit anneals ("heals") over time and will have lower current leakage the next time it is activated. The rate at which a CMOS integrated circuit will anneal depends on electron-hole pair generation and trapped charge.

The partition state machine 108 may monitor the current leakage of the powered-on first circuit under test while the second circuit under test is powered-off. The partition state machine 108 may then switch between powering on of the first circuit and powering on of the second circuit based on the monitored leakage current. In this way, when the leakage current level of one circuit increases to a point when a threshold is exceeded, the state machine 108 can power off that circuit and switch to the other circuit and vice versa. By swapping back and forth between two circuits, one circuit may be in use, while the other is annealing (healing). This provides a radiation hardened technique that improves the longevity of the partition(s) and thus the integrated circuit reliability. Although two circuits per partition are illustrated, it is contemplated that additional circuits may be included in one or more partitions, with the partitioned state machine 108 cycling through the circuits.

The partition state machine 108 may monitor leakage current of the first circuit 104 and the second circuit 106 periodically. In one embodiment, the partition state machine 108 performs monitoring based on control signals (e.g., timing signals or strobes) received via control line(s) 110. The partition state machine 108 may include internal storage (not shown) for storing parameters, e.g., upon start up.

The partition state machine 108 may be configured to initially power on the first circuit 104 and store an initial value representing first circuit current leakage baseline and power on the second circuit 106 and store an initial value representing second circuit current leakage baseline. The partition state machine then controls the first circuit such that it is powered on and controls the second circuit such that it is powered off (e.g., with a high impedance presented at the output). At this stage, processing of signals coming from the input bus 204 are processed by the first circuit 104 and a result is presented by the first circuit 104 at the output bus 206. In addition, if exposed to radiation, operation of the first circuit 104 is affected as indicated by the first circuit current leakage monitored by the state machine. Once the current leakage of the first circuit 104 exceeds a threshold based on the initial value representing first circuit current leakage when powered on, the partition state machine 108 then controls the second circuit such that it is powered on and controls the first circuit such that it is powered off (e.g., with a high impedance presented at the output). The partition state machine 108 then continuously monitors the active circuit and switches back and forth (substantially simultaneously) between which circuit is active whenever the current leakage of the active circuit exceeds the threshold for that circuit. The initial representing current leakage may be determined and stored once, e.g., the first time the respective circuit is activated, or may be determined and stored at other times such as upon each activation.

The baseline threshold may be a function of several parameters including input vectors at primary input, bias voltage and $V_{GS}$ of an associated transimpedance amplifier. In an embodiment, variable are returned as close as possible to their initial states prior to taking another leakage current sample. Sampling and comparing of IDDQ may be performed by (1.) enabling selective CUT with state machine, (2.) driving Tamp to 0 $V_{GS}$ with state machine, (3.) strobing CLK in comparator and sampling IDDQ from Tamp with state machine, (4.) comparing sampled Tamp with reference threshold, (5.) if sampled Tamp value is less than reference value then increase Tamp $V_{GS}$ by a predetermined increment and proceed at step (3.), and (6.) if sampled Tamp value is greater than reference value then excessive IDDQ leakage current has been detected.

In one embodiment the voltage bus 200, ground 202, input bus 204, and output bus 206 each extend outside the partition to one or more other partitions. In other embodiments, one or more of the voltage bus 200, ground 202, input bus 204, and output bus 206 may be internal to the partition.

Figure 2B:
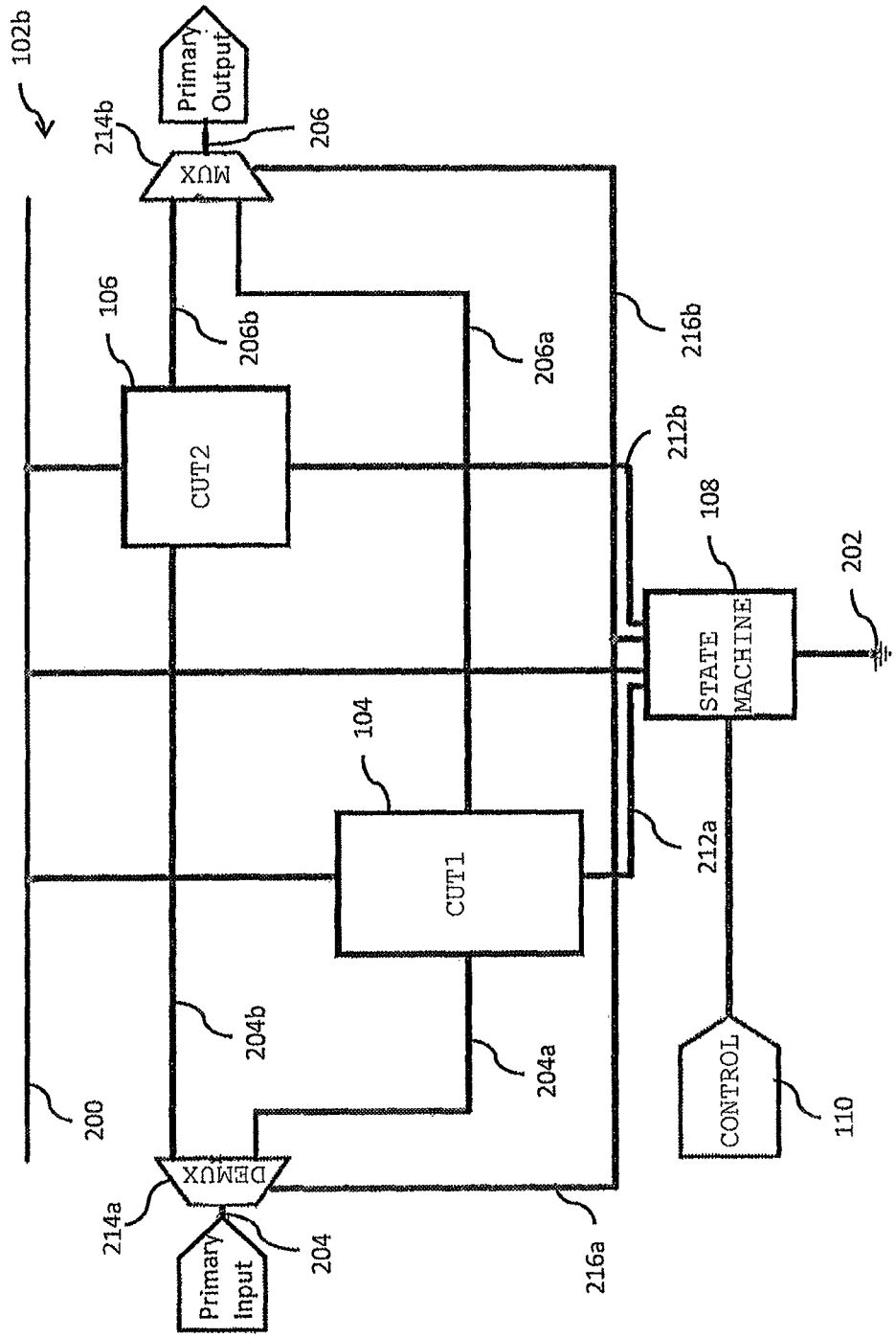
FIG. 2B is a block diagram partially in schematic form of a radiation hardened partition of an integrated circuit in accordance with aspects of the present invention.

FIG. 2b depicts a high level configuration of a partition 102b in accordance with another embodiment of the present invention. The partition 102b in FIG. 2b is similar to partition 102a (FIG. 2a), with the exception that a demultiplexer (DMUX) 214a and a multiplexer (MUX) 214b have been added along with respective control lines 216a and 216b coupling the DMUX 214a and MUX 214b to the partition state machine 208. In accordance with this embodiment, the first circuit 104 and the second circuit 106 do not need to be configured for a tri-state output operation and thus control lines 210a/210b may be eliminated. Rather, the partitioned state machine 108 is configured to control the DMUX 214a to route signals on the input bus 204 to the first and second circuits and to control the MUX 214b to route signals from the first and second circuits to the output bus 206. It is contemplated that the DMUX 214a may be omitted, e.g., if the first circuit 104 and the second circuit 106 do not impose a performance penalty due to input parasitics.

The partition state machine 108 may be configured to store an initial value representing the current leakage of the first circuit 104 when it is powered on and an initial value representing the current leakage of the second circuit 106 when it is powered on. The partition state machine then controls the DMUX 214a such that signals on input bus 204 are passed along a first path 204a to the first circuit 104 and signals from the first circuit 104 are passed along a first output path through the MUX 214b and onto the output bus 206 (resulting in the activation of the first circuit). Operation of the first circuit 104 will be affected by radiation while it is powered on as indicated by an increase in current leakage monitored by the state machine. Once the current leakage of the first circuit 104 exceeds a threshold based on the initial current leakage when powered on, the partition state machine 108 then controls DMUX 214a such that signals on input bus 204 are passed along a second path 204b to the second circuit 106 and signals from the second circuit 106 are passed along a second output path through the MUX 214b and onto the output bus 206 (resulting in the activation of the second circuit). Operation of the second circuit 104 will be affected by radiation while it is powered on as indicated by an increase in current leakage monitored by the state machine, while the first circuit anneals ("heals"). The partition state machine 108 then continuously monitors the active circuit and switches back and forth (substantially simultaneously) between which circuit is active (e.g., by controlling the signal flow through the DMUX 214a and MUX 214b) whenever the current leakage of the active circuit exceeds the threshold based on the initial current leakage for that circuit.

Figure 3:
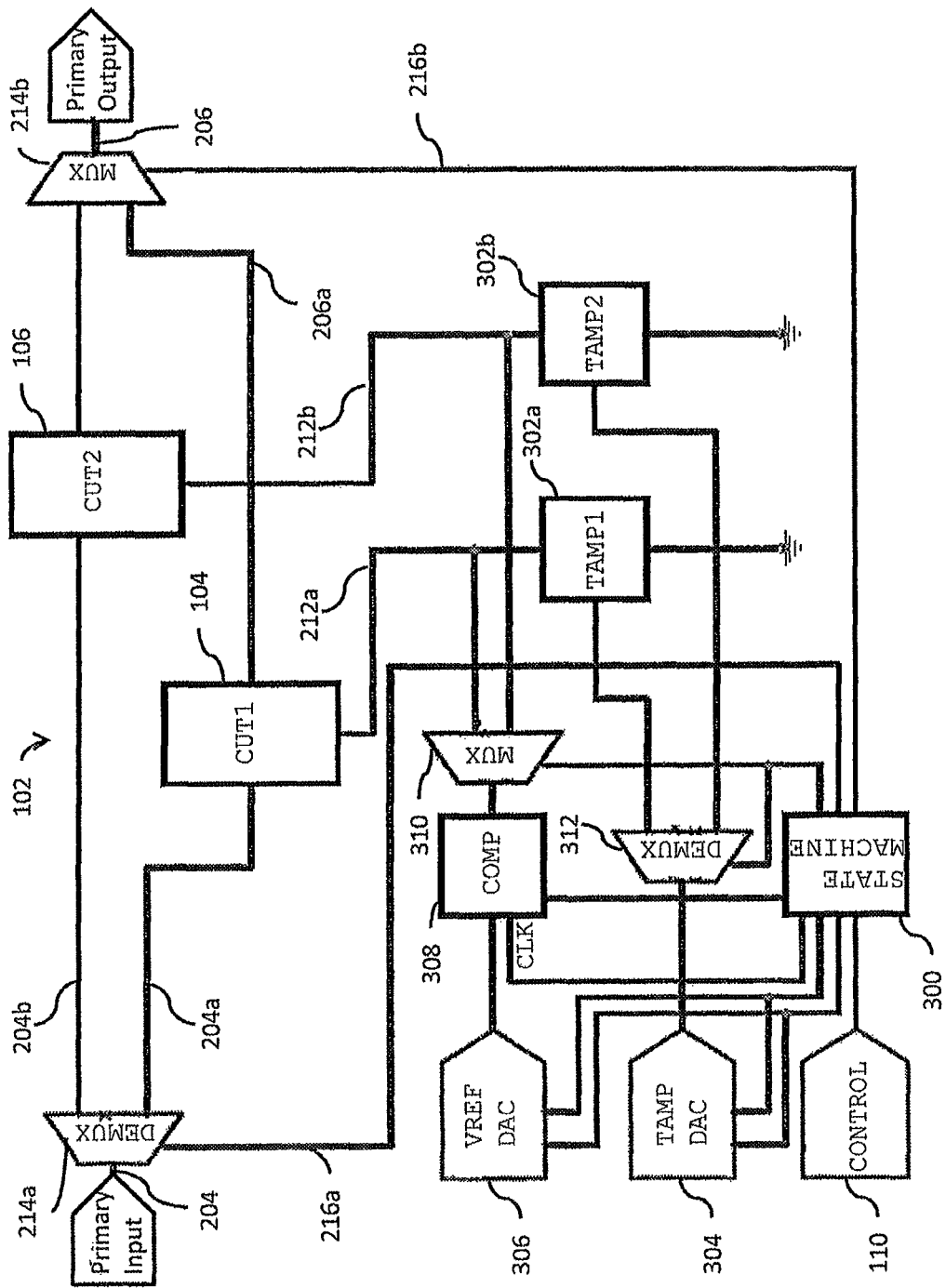
FIG. 3 is a detailed block diagram that is partially in schematic form of a partition in accordance with aspects of the present invention.

FIG. 3 depicts the partition 102b of FIG. 2b with the partition state machine 108 separated into sub components in accordance with one embodiment of the present invention. The illustrated sub components of the partition state machine 108 include a state machine 300, a first transimpedance amplifier 302a, a second transimpedance amplifier 302b, a first digital-to-analog converter (DAC) 304, a second DAC 306, a comparator 308, a multiplexer 310, and a demultiplexer 312. Suitable modifications to the partition state machine 108 at the sub component level for use in the partition 102a of FIG. 2a will be understood by one of skill in the art from the description herein. Additionally, suitable and sub components for use in the present invention will be understood by one of skill in the art from the description herein.

State machine 300 may control DMUX 214a and MUX 214b as described above with reference to FIG. 2b. A first voltage is developed across the first transimpedance amplifier 302a that is based on the quiescent current sample from the first circuit under test (circuit 104) via path 212a when the first circuit under test is powered on and the second circuit under test is powered off and a second voltage is developed across the second transimpedance amplifier 302b that is based on the quiescent current sample from the second circuit under test (circuit 106) via path 212b when the second circuit under test is powered on and the first circuit under test is powered off. The transimpedance amplifiers 302a/302b may each be implemented as metal oxide semiconductor field effect transistors (MOSFETs). The state machine 300 controls the multiplexer 310 to pass the developed voltage representing IDDQ for the circuit that is currently active to a comparator 308.

In the illustrated embodiment, state machine 300 indirectly controls the transimpedance amplifiers 302a/302b. The state machine 300 provides a digital signal to a digital to analog converter 304 to develop an output analog signal. The state machine 300 controls a demultiplexer 312 to provide the analog signal to the first transimpedance amplifier 302a when the first circuit 104 is powered on and to provide the analog signal to the second transimpedance amplifier 302b when the second circuit 106 is powered on. In one embodiment, the state machine 300 modulates the transimpedance amplifier 302a/302b corresponding to the powered on circuit 104/106 via the analog signal across a swept range of gate voltages. This makes it possible to acquire a range of multiple IDDQ samples, creating a "signature" of the IDDQ over an operating range for the circuit. Furthermore, this unique feature eliminates the constraint of limiting the sizes of the circuits 104/106. In other words, it is now possible to instantiate circuits of almost any size.

The use of transimpedance amplifiers 302a/302b, enables the handling of two extreme situations. During functional testing, the powered on circuit draws a large transient current. The transimpedance amplifiers are capable of handling this large current without introducing a significant voltage drop. Once the current settles into a steady-state, the transimpedance amplifiers are capable of detecting the small current leakages produced during operation of the active circuit. Through the use of the transimpedance amplifiers, a small resistance can be developed whenever a large transient current occurs and a large equivalent input resistance can be developed when detecting low level current leakage.

State machine 300 also provides a digital signal to another digital to analog converter 306 to develop an analog voltage reference signal (Vref) based on an initial current leakage of the active circuit for comparison by the comparator 308 to the voltages translated from the present current leakage for the active circuit by the transimpedance amplifiers 302a/302b. State machine 300 may store values based on voltages translated from the current leakage of the circuits 104/106 by the transimpedance amplifiers 302a/302b when the first circuit 104 and the second circuit 106 are initially powered on to obtain values representative of low leakage circuits 104/106 prior to exposure to radiation. In embodiments where the state machine 300 applies voltages to transimpedance amplifiers 302a/302b to produce a signature of the IDDQ values for the circuits 104/106, the state machine 300 may store a plurality of values as the signature, e.g., in an internal storage register (not shown).

Figure 4:
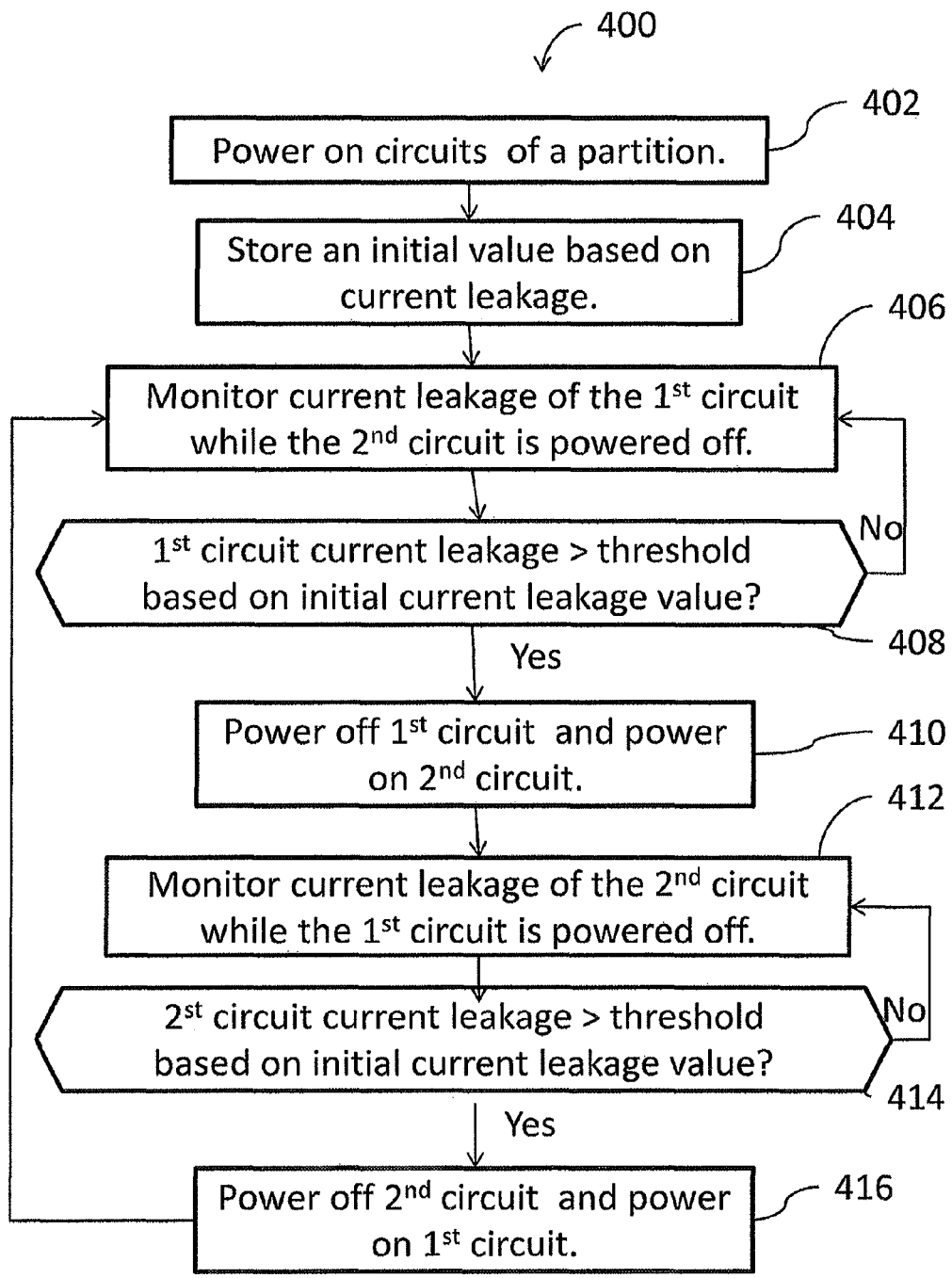
FIG. 4 is a flow chart of a chip level recovery method in accordance with aspects of the present invention.

FIG. 4 depicts a flow chart 400 of steps for implementing a radiation hardened chip level integrated recovery method in accordance with aspects of the present invention. The steps of flow chart 400 are described below with reference to the components depicted in FIG. 3 to facilitate description. Other suitable components for implementing the steps of flow chart 400 will be understood by one of skill in the art from the description herein. It is to be understood that various steps of flow chart 400 may be performed in an order other than as depicted and/or substantially simultaneously with other steps. Additionally, in some embodiments, one or more of the steps depicted in flow chart 400 may be omitted without departing from the scope of the present invention.

At block 402, circuits within a partition are powered on. In one embodiment, circuits 104/106 of partition 102 are powered on. The circuits may be powered on individually in any order such that the first circuit 104 may be powered on when the second circuit is powered off and vice versa.

At block 404, an initial value is stored based on current leakage associated with each circuit and the initial value may represent one or more voltages based on the current leakage. In one embodiment, the state machine 300 first stores an initial range of voltage values (e.g., a current leakage signature in an internal register) generated by the first transimpedance amplifier 302a that represents the current leakage of the first circuit 104 and then stores an initial range of voltage values (e.g., a current leakage signature in an internal register) generated by the second transimpedance amplifier 302b that represents the current leakage of the second circuit 106.

At block 406, the current leakage may be monitored for the first circuit while the second circuit is powered off. The current leakage may be monitored by monitoring a representative voltage generated by a transimpedance amplifier based on the current leakage. In one embodiment, the current leakage of the first circuit 104 is monitored while that circuit is active and the second circuit 106 is inactive (i.e., powered off). In accordance with this embodiment, the state machine 300 may control DMUX 204 and MUX 206 to route signals to/from the first circuit 104. Additionally, the state machine 300 may control MUX 310 to pass voltages corresponding to the first circuit and may control DMUX 312 to pass a signal to the transimpedance amplifier 302a corresponding to the first circuit 104.

At block 408, the monitored current leakage of the first circuit is compared to a threshold that is based on the initial current leakage value. The monitored current leakage of the first circuit may be compared to a threshold by comparing the representative voltage generated by a transimpedance amplifier based on the current leakage of the active circuit to a threshold voltage based on an initial current leakage for the active circuit. If the threshold is not exceeded (indicating operation of the first circuit is within an acceptable range), processing proceeds to block 406 and the first circuit 104 continues to be monitored. If the threshold is exceeded, processing proceeds to block 410. The threshold is selected such that the first circuit is deactivated prior to having its operation irreversibly affected by exposure to radiation. Selection of suitable thresholds will be understood by one of skill in the art from the description herein. This enables the present invention to provide a dynamic real time process that is independent and allows circuits (e.g., circuits 104/106) to be essentially any size.

In one embodiment, state machine 300 provides a signal to DAC 306, which provides one or more voltage levels to comparator 308 for comparison to the voltage(s) corresponding to the monitored current leakage. The voltage levels may be based on the initial values stored at block 402. In one embodiment, the state machine 300 stores a value based on the initial current leakage that provides the reference voltage. In another embodiment, the state machine 300 stores the initial value and the comparator 308 generates the reference value based on the initial current leakage. Other embodiments for generating the reference value will be understood by one of skill in the art from the description herein.

At block 410, the first circuit is powered off and the second circuit is powered on. In one embodiment, state machine 300 powers off circuit 104 and powers on circuit 106, e.g., via DMUX 214a and MUX 214b. "Make-before-break" circuitry (not shown) may be integrated into partitions to ensure smooth transitions between the first and second circuits 104/106. Suitable make-before-break circuitry will be understood by one of skill in the art from the description herein.

At block 412, the parameter (e.g., current leakage) may be monitored for the second circuit while the first circuit is powered off. In one embodiment, the current leakage of the second circuit 106 is monitored while that circuit is active and the first circuit 104 is inactive (i.e., powered off). In accordance with this embodiment, the state machine 300 may control DMUX 204 and MUX 206 to route signals to/from the second circuit 106. Additionally, the state machine 300 may control MUX 310 to pass voltages corresponding to the second circuit and may control DMUX 312 to pass a signal to the transimpedance amplifier 302b corresponding to the second circuit 106.

At block 414, the parameter of the second circuit is compared to a threshold that is based on the initial value. If the threshold is not exceeded (indicating the second circuit performance remains within an acceptable range), processing proceeds to block 412 and the second circuit 106 continues to be monitored. If the threshold is exceeded, processing proceeds to block 416. The threshold value is based on the initial value and is selected such that the second circuit will provide suitable results as long as the threshold is not exceeded. Selection of suitable thresholds will be understood by one of skill in the art from the description herein.

At block 416, the second circuit is powered off and the first circuit is powered on. In one embodiment, state machine 300 powers off circuit 106 and powers on circuit 104, e.g., via DMUX 214a and MUX 214b. Processing then proceeds at block 406, with monitoring of the first circuit. The process may then repeat with the state machine 300 swapping between the first and second circuits 104/106 in order to swap out a circuit whose leakage current has increased due to radiation with a circuit that has had a period of time to recover.

Figure 5:
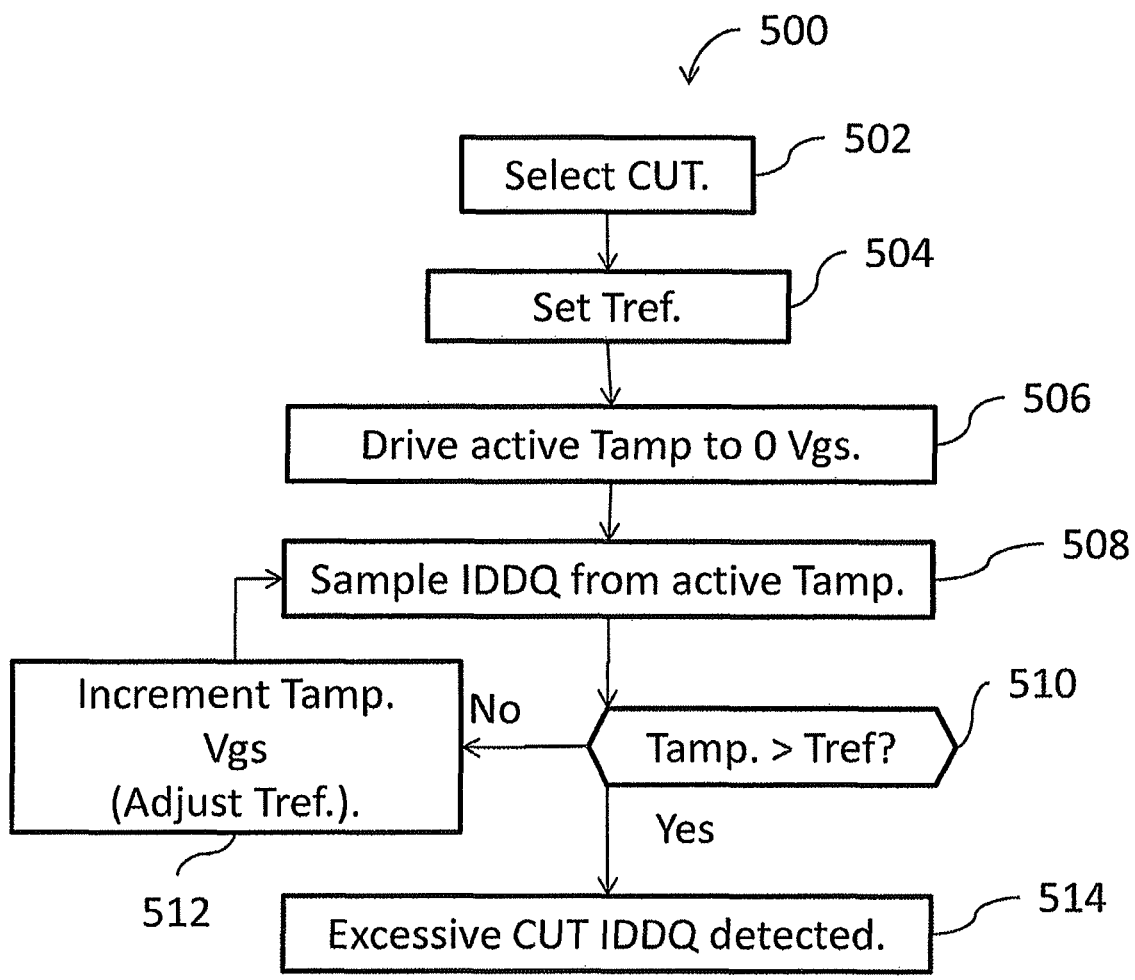
FIG. 5 is a flow chart of a threshold setting and detection method in accordance with aspects of the present invention.

FIG. 5 depicts a flow chart 500 of steps for setting a threshold for a CUT and detecting when the threshold for that CUT has been exceeded in accordance with aspects of the present invention. The steps of flow chart 500 are described below with reference to the components depicted in FIG. 3 to facilitate description. Other suitable components for implementing the steps of flow chart 500 will be understood by one of skill in the art from the description herein. It is to be understood that various steps of flow chart 500 may be performed in an order other than as depicted and/or substantially simultaneously with other steps. Additionally, in some embodiments, one or more of the steps depicted in flow chart 500 may be omitted without departing from the scope of the present invention.

At block 502, a CUT within a partition is selected. In one embodiment, a partition state machine 108 within a partition 102 selects a CUT (e.g., CUT1 104). The partition state machine 300 may select the CUT based on instructions being executed by the partition state machine 300 and/or responsive to a control signal received on control line(s) 110. The partition state machine 300 may select the CUT by configuring the analog DEMUX 312 to couple the Tamp DAC 304 to the Tamp of the selected CUT (e.g., Tamp1 302a) and configuring the analog MUX 310 to couple the IDDQ as converted by the Tamp for the selected CUT (e.g., Tamp1 302a) to the comparator 308. Additionally, the partition state machine 300 may enable the selected CUT and disabling the other CUT(s) (e.g., for tri-state CUTs) or configuring the MUX 214b and optionally the DEMUX 214a to couple the selected CUT to the I/O lines 204/206 (e.g., for non-tri-state CUTs).

At block 504, a reference threshold (Tref) is set. In one embodiment, Tref is set in a memory of the partition state machine 300. A pass/fail threshold may be developed from a simulation (theoretical) and empirical data. This threshold may rely on total radiation dose, dose rate, and type of radiation encountered as well as process technology and feature size. The threshold may be a radiation dose profile implemented by the partition state machine core as lookup tables, prediction algorithms, IDDQ leakage profiles (dynamic real time), etc.

At block 506, the Tamp is driven to an initial value. In an embodiment where the Tamp is a N-channel field effect transistors (NFET), the gate-source of the NFET may be driven to 0 volts (e.g., 0 Vgs). The partition state machine 300 may configure the digital-to-analog converter 304 to develop 0 V for delivery to the Tamp of the selected CUT (e.g., Tamp1 302a) through DEMUX 312.

At block 508, the leakage current (IDDQ) of the selected CUT is sampled. The partition state machine 300 may sample the leakage current developed by the Tamp of the selected CUT (e.g., Tamp1 302a) through MUX 310 by strobing a clock (clk) input of the comparator 308.

At block 510, the sampled IDDQ is compared to the reference threshold. In one embodiment, the comparator 308 compares a sample voltage developed from the sampled IDDQ by the Tamp of the selected CUT (e.g., Tamp1 302a) to a reference voltage developed by digital-to-analog converter 306 under the control of the partitioned state machine 300. If the sampled voltage does not exceed the reference, processing proceeds at block 512 with the Tamp driven to another value in the reference profile (e.g., 0.1 Vgs for an NFET implementation). Otherwise, if the sample voltage exceeds the reference voltage, a determination is made that excessive leakage current has been detected at block 514; and the partition state machine 300 will switch to using the other CUT.

Although the invention is illustrated and described herein with reference to specific embodiments, the invention is not intended to be limited to the details shown. Rather, various modifications may be made in the details within the scope and range of equivalents of the claims and without departing from the invention. For example, although two circuits per partition are illustrated, the present invention is applicable to partitions with more than two partitions and suitable modifications to the components and methods described herein will be understood by one of skill in the art from the description herein.

What is claimed:

1. A chip level integrated recovery apparatus for use in an integrated circuit having a global ground, the apparatus comprising:
a first circuit under test (CUT1) within a partition of the integrated circuit, the CUT1 having a CUT1 ground isolated from the global ground of the integrated circuit;
a second circuit under test (CUT2) within the partition of the integrated circuit, the CUT2 having a CUT2 ground isolated from the global ground of the integrated circuit; and
a partition state machine coupled to the CUT1 and the CUT2 and configured to:
1) monitor current leakage (IDDQ) of the CUT1 while the CUT1 is powered on,
2) power on the CUT2 and power off the CUT1 when the monitored CUT1 current leakage exceeds a first current leakage threshold,
3) monitor current leakage (IDDQ) of the CUT2 while the CUT2 is powered on, and
4) power on the CUT1 and power off the CUT2 when the monitored CUT2 current leakage exceeds a second current leakage threshold.

2. The apparatus of claim 1, wherein the CUT1 and the CUT2 are at least substantially identical.

3. The apparatus of claim 1, wherein the partition state machine comprises:
a first transimpedance amplifier coupled to the CUT1 to translate the CUT1 current leakage when the CUT1 is powered on to generate a first voltage;
a second transimpedance amplifier coupled to the CUT2 to translate current leakage of the CUT2 when the CUT2 is powered on to generate a second voltage; and
a comparator coupled to the first and second transimpedance amplifiers, the comparator configured to compare the first voltage to a first reference voltage based on the first current leakage threshold when the CUT1 is powered on and to compare the second voltage to a second reference voltage based on a second current leakage threshold when the CUT2 is powered on.

4. The apparatus of claim 3, further comprising:
a state machine coupled to the first and second transimpedance amplifiers and the comparator, the state machine setting the first and second threshold voltages for the comparator and controlling the first and second transimpedance amplifiers.

5. The apparatus of claim 4, wherein the state machine is coupled outside the partition to receive a global timing signal.

6. The apparatus of claim 4, wherein the partition state machine further comprises:

a multiplexer having an output extending outside the partition to provide an output signal, a first input coupled to an output of the CUT1, a second input coupled to an output of the CUT2, and a control coupled to the state machine.

7. The apparatus of claim 6, wherein the partition state machine further comprises:
a demultiplexer having an input extending outside the partition to receive an input signal, a first output coupled to the input of the CUT1, a second output coupled to the input of the CUT2, and a control coupled to the state machine.

8. The apparatus of claim 1, wherein the partition state machine is further configured to monitor current leakage of the CUT2 while the CUT2 is powered on and to power on the CUT1 and power off the CUT2 when the monitored CUT2 current leakage exceeds a second current leakage threshold.

9. The apparatus of claim 1, further comprising:
a third circuit under test (CUTS) at least substantially the same as the CUT1 and the CUT2;
wherein the partition state machine is further configured to monitor current leakage of the CUT2 while the CUT2 is powered on and to power on the CUT3 and power off the CUT2 when the monitored CUT2 current leakage exceeds a second current leakage threshold.

10. The apparatus of claim 1, wherein the CUT1 ground is isolated from the CUT2 ground.

11. An integrated circuit comprising:
a plurality of the apparatus of claim 1.

12. A radiation hardened chip level integrated recovery method comprising:
powering a first circuit under test (CUT1) of a partition within an integrated circuit, the partition including the CUT1 and a second circuit under test (CUT2);
monitoring current leakage (IDDQ) of the CUT1 while the CUT1 is powered on and the CUT2 is powered off;
storing a first range of values representing a first current leakage signature over an operating range of the CUT1;
powering off the CUT1 and powering on the CUT2 when the monitored CUT1 current leakage exceeds a corresponding first current leakage threshold within the stored first range of values;
monitoring current leakage (IDDQ) of the CUT2 while the CUT2 is powered on and the CUT1 is powered off;
storing a second range of values representing a second current leakage signature over an operating range of the CUT2; and
powering off the CUT2 and powering on the CUT1 when the monitored CUT2 current leakage exceeds a corresponding second current leakage threshold within the stored second range of values.

13. The method of claim 12, wherein the first current leakage threshold is based on the quiescent current of the CUT1 over the operating range of the CUT1 when the CUT1 was powered on.

14. The method of claim 12, wherein the CUT1 and the CUT2 are at least substantially identical.

15. The method of claim 12, further comprising:
monitoring current leakage (IDDQ) of the CUT2 while the CUT2 is powered on and the CUT1 is powered off;
storing a second range of values representing a second current leakage signature over an operating range of the CUT2; and
powering off the CUT2 and powering on the CUT1 when the monitored CUT2 current leakage exceeds a corresponding second current leakage threshold within the stored second range of values.

16. The method of claim 15, wherein:
the first current leakage threshold is based on the quiescent current of the CUT1 over an operating range of the CUT1 when the CUT1 was powered on; and
the CUT2 current leakage threshold is based on the quiescent current of the CUT2 over an operating range of the CUT2 when the CUT2 was powered on.

17. The method of claim 15, further comprising:
repeating the powering off the CUT1 and the powering on the CUT2 when the monitored CUT1 current leakage exceeds the corresponding first current leakage threshold; and
repeating the powering off the CUT2 and the powering on the CUT1 when the monitored CUT2 current leakage exceeds the corresponding second current leakage threshold.

18. The method of claim 12, wherein the monitoring comprises:
sampling the CUT1 current leakage in response to a timing signal initiated from global chip logic for the integrated circuit.

19. The method of claim 12, further comprising:
storing a first range of value representing a first range of voltages based on initial quiescent currents of the CUT1 over an operating range of the CUT1;
generating a range of reference voltages from the stored first range of values;
converting the monitored current leakage to an equivalent voltage; and
powering off the CUT1 and powering on the CUT2 when the equivalent voltage for the monitored current leakage exceeds a corresponding voltage threshold within the range of reference voltages.

20. The method of claim 12, further comprising:
switching an input signal received at an input of a demultiplexer from the CUT1 to the CUT2 when the CUT1 is powered off and the CUT2 is powered on; and
switching an output of a multiplexer from the CUT1 to the CUT2 when the CUT1 is powered off and the CUT2 is powered on.

* * * * *